US011526091B2

United States Patent
Elazhary et al.

(10) Patent No.: US 11,526,091 B2
(45) Date of Patent: Dec. 13, 2022

(54) SENSOR APPARATUS AND METHOD FOR LITHOGRAPHIC MEASUREMENTS

(71) Applicant: ASML HOLDING N.V., Veldhoven (NL)

(72) Inventors: Tamer Mohamed Tawfik Ahmed Mohamed Elazhary, New Canaan, CT (US); Justin Lloyd Kreuzer, Trumbull, CT (US); Yuxiang Lin, Wilton, CT (US); Kirill Urievich Sobolev, Brookfield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 17/600,174

(22) PCT Filed: Mar. 25, 2020

(86) PCT No.: PCT/EP2020/058250
§ 371 (c)(1),
(2) Date: Sep. 30, 2021

(87) PCT Pub. No.: WO2020/207794
PCT Pub. Date: Oct. 15, 2020

(65) Prior Publication Data
US 2022/0179331 A1 Jun. 9, 2022

Related U.S. Application Data

(60) Provisional application No. 62/831,001, filed on Apr. 8, 2019.

(51) Int. Cl.
*G03F 9/00* (2006.01)
(52) U.S. Cl.
CPC .......... *G03F 9/7049* (2013.01); *G03F 9/7088* (2013.01)

(58) Field of Classification Search
CPC .............................. G03F 9/7049; G03F 9/7088
See application file for complete search history.

(56) References Cited

U.S. PATENT DOCUMENTS

| | | | |
|---|---|---|---|
| 6,952,253 B2 | 10/2005 | Lof et al. | |
| 2006/0066855 A1 | 3/2006 | Boef et al. | |
| 2013/0114085 A1* | 5/2013 | Wang | G01N 21/211 356/445 |
| 2013/0148121 A1* | 6/2013 | Den Boef | G01B 11/14 356/401 |

(Continued)

FOREIGN PATENT DOCUMENTS

| | | |
|---|---|---|
| EP | 3575875 | 12/2019 |
| JP | 2006060214 | 3/2006 |

(Continued)

OTHER PUBLICATIONS

International Search Report and Written Opinion issued in corresponding PCT Patent Application No. PCT/EP2020/058250, dated June 26, 2020.

(Continued)

*Primary Examiner* — Peter B Kim
(74) *Attorney, Agent, or Firm* — Pillsbury Winthrop Shaw Pittman LLP

(57) ABSTRACT

Apparatus for, and method of, measuring a parameter of an alignment mark on a substrate in which an optical system is arranged to receive at least one diffraction order from the alignment mark and the diffraction order is modulated at a pupil or a wafer conjugate plane of the optical system, a solid state optical device is arranged to receive the modulated diffraction order, and a spectrometer is arranged to receive the modulated diffraction order from the solid state optical device and to determine an intensity of one or more spectral components in the modulated diffraction order.

20 Claims, 6 Drawing Sheets

(56) References Cited

U.S. PATENT DOCUMENTS

| | | | |
|---|---|---|---|
| 2017/0082932 A1 | 3/2017 | Fu et al. | |
| 2017/0097574 A1* | 4/2017 | Goodwin | G03F 7/70141 |
| 2017/0255104 A1* | 9/2017 | Polo | G01B 11/00 |
| 2018/0073992 A1 | 3/2018 | Van Voorst et al. | |
| 2018/0149987 A1* | 5/2018 | Mathijssen | G03F 7/70141 |
| 2018/0231900 A1* | 8/2018 | Tinnemans | G03F 9/7088 |
| 2018/0259863 A1 | 9/2018 | Komaki | |
| 2019/0049866 A1 | 2/2019 | Huisman et al. | |
| 2019/0064677 A1 | 2/2019 | Jak et al. | |
| 2020/0089135 A1 | 3/2020 | Goorden et al. | |
| 2021/0132509 A1* | 5/2021 | Huisman | G03F 7/70633 |

FOREIGN PATENT DOCUMENTS

| | | | | |
|---|---|---|---|---|
| JP | 2008537104 A * | 9/2008 | | |
| JP | 2018535560 | 11/2018 | | |
| JP | 2019503504 | 2/2019 | | |
| JP | 2019507368 | 3/2019 | | |
| TW | 201837623 | 10/2018 | | |
| WO | WO-2017053581 A * | 3/2017 | | G03F 7/70633 |
| WO | 2017097564 | 6/2017 | | |
| WO | 2017209132 | 12/2017 | | |
| WO | 2018114152 | 6/2018 | | |

OTHER PUBLICATIONS

Taiwanese Office Action issued in corresponding Taiwanese Patent Application No. 109111622, dated Feb. 9, 2021.
Japanese Office Action issued in corresponding Japanese Patent Application No. 2021-556296, dated Oct. 13, 2022.

* cited by examiner

SENSOR APPARATUS AND METHOD FOR LITHOGRAPHIC MEASUREMENTS

CROSS-REFERENCE TO RELATED APPLICATIONS

This application is the U.S. national phase entry of PCT Patent Application No. PCT/EP2020/058250, which was filed on Mar. 25, 2020, which claims the benefit of priority of U.S. Provisional Patent Application No. 62/831,001, which was filed on Apr. 8, 2019, and which is incorporated herein in its entirety by reference.

FIELD

The present disclosure to a sensor apparatus and method for determining information from a target of a substrate. The sensor apparatus may form part of a lithographic apparatus. The sensor apparatus may form part of a metrology tool. The sensor apparatus may be a standalone device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually reduced while the amount of functional elements, such as transistors, per device has been steadily increasing over decades, following a trend commonly referred to as 'Moore's law'. To keep up with Moore's law the semiconductor industry is pursuing technologies that enable the creation of progressively smaller features. To project a pattern on a substrate a lithographic apparatus may use electromagnetic radiation. The wavelength of this radiation at least partially determines the minimum size of features that are patterned on the substrate. Typical wavelengths currently in use are 365 nm (i-line), 248 nm, 193 nm and 13.5 nm. A lithographic apparatus which uses extreme ultraviolet (EUV) radiation, having a wavelength within a range of 4 nm to 20 nm (e.g., 6.7 nm or 13.5 nm) may be used to form smaller features on a substrate than a lithographic apparatus which uses, for example, radiation having a wavelength of 193 nm.

In order to control the lithographic process to place device features accurately on the substrate, alignment marks are generally provided on the substrate, and the lithographic apparatus includes one or more alignment measurement systems by which positions of alignment marks on a substrate can be measured accurately. These alignment measurement systems are effectively position measuring apparatuses. The alignment marks aid in the accurate placement of a process layer formed on the substrate relative to previously formed process layers. Alignment measurements are typically made, within a lithographic apparatus, each time a substrate is loaded into the lithographic apparatus, before each process layer is formed. It is an object of the present invention to provide a sensor apparatus and method of determining a position of a target on the substrate which at least partially addresses one or more of the problems of the prior art, whether identified herein or elsewhere.

SUMMARY

The following presents a simplified summary of one or more embodiments in order to provide a basic understanding of the embodiments. This summary is not an extensive overview of all contemplated embodiments and is not intended to identify key or critical elements of all embodiments nor set limits on the scope of any or all embodiments. Its sole purpose is to present some concepts of one or more embodiments in a simplified form as a prelude to the more detailed description that is presented later.

According to one aspect of an embodiment there is disclosed an apparatus for measuring a parameter of an alignment mark on a substrate, the apparatus comprising an optical system arranged to receive at least one diffraction order from the alignment mark and including a configurable spatial light modulator to modulate an irradiance distribution of the at least one diffraction order at a pupil plane of the optical system, and/or plane conjugate to alignment mark plane, to produce a modulated diffraction order, and a solid state optical device arranged to receive the modulated diffraction order. The apparatus may further comprise a spectrometer arranged to receive the modulated diffraction order from the solid state optical device and to determine an intensity of one or more spectral components in the modulated diffraction order. The diffraction order may be a first order diffraction order. The configurable spatial light modulator may comprise a constant apodizer performing an apodization characterized as a low order polynomial. The configurable spatial light modulator may comprise a digital micromirror device. The configurable spatial light modulator may comprise a liquid crystal device. The configurable spatial light modulator may comprise a liquid crystal on silicon device. The configurable spatial light modulator may comprise a micro-electro-mechanical system. The configurable spatial light modulator may shape the diffraction order according to at least one normal basis function. The spectrometer may comprise a plurality of dichroic mirrors and photo detectors. The spectrometer may comprise a demultiplexer which may extract a coefficient of the at least one basis function. The spectrometer may comprise a demultiplexer and a photo detector. The solid state optical device may comprise a multi-mode optical fiber. The parameter may be asymmetry in the alignment mark. The parameter may be variation in angular content of diffraction order measured at the pupil or wafer conjugate planes. The variation may be displacement in the center of gravity of diffraction order irradiance distribution. The parameter may be an amount of tilt in the alignment mark. The parameter may be a height variation in a position of the alignment mark.

According to another aspect of an embodiment there is disclosed a method of measuring a parameter of an alignment mark on a substrate, the method comprising generating at least one diffraction order and modulating the diffraction order in a pupil or wafer conjugate plane. The method may further comprise the steps of using a solid state optical device to integrate the diffraction order and determining spectral content of the diffraction order. The diffraction order may be a first order diffraction order. The modulating step may be performed by a spatial light modulator. The modulating step may be performed by a digital micromirror device. The modulating step may be performed by a liquid crystal device. The modulating step may be performed by a liquid crystal on silicon device. The modulating step may be performed by a micro-electro-mechanical system. The modulating step may comprise shaping the diffraction order according to at least one normal basis function. The step of using a solid state optical device to integrate the diffraction order solid state optical device may be performed using a multi-mode optical fiber. The step of determining spectral content of the diffraction order may comprise extracting a coefficient of the at least one basis function. The step of determining spectral content of the diffraction order may be performed by a spectrometer comprising a demultiplexer and a photo detector. The parameter may be asymmetry in the alignment mark. The parameter may be variation in angular content of diffraction order measured at the pupil or wafer conjugate plane. The variation may be displacement in the center of gravity of a diffraction order irradiance distribution. The parameter may be an amount of tilt in the alignment mark. The parameter may be a height variation in a position of the alignment mark.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the present invention and to enable a person skilled in the relevant art(s) to make and use the present invention.

DETAILED DESCRIPTION

Figure 1:
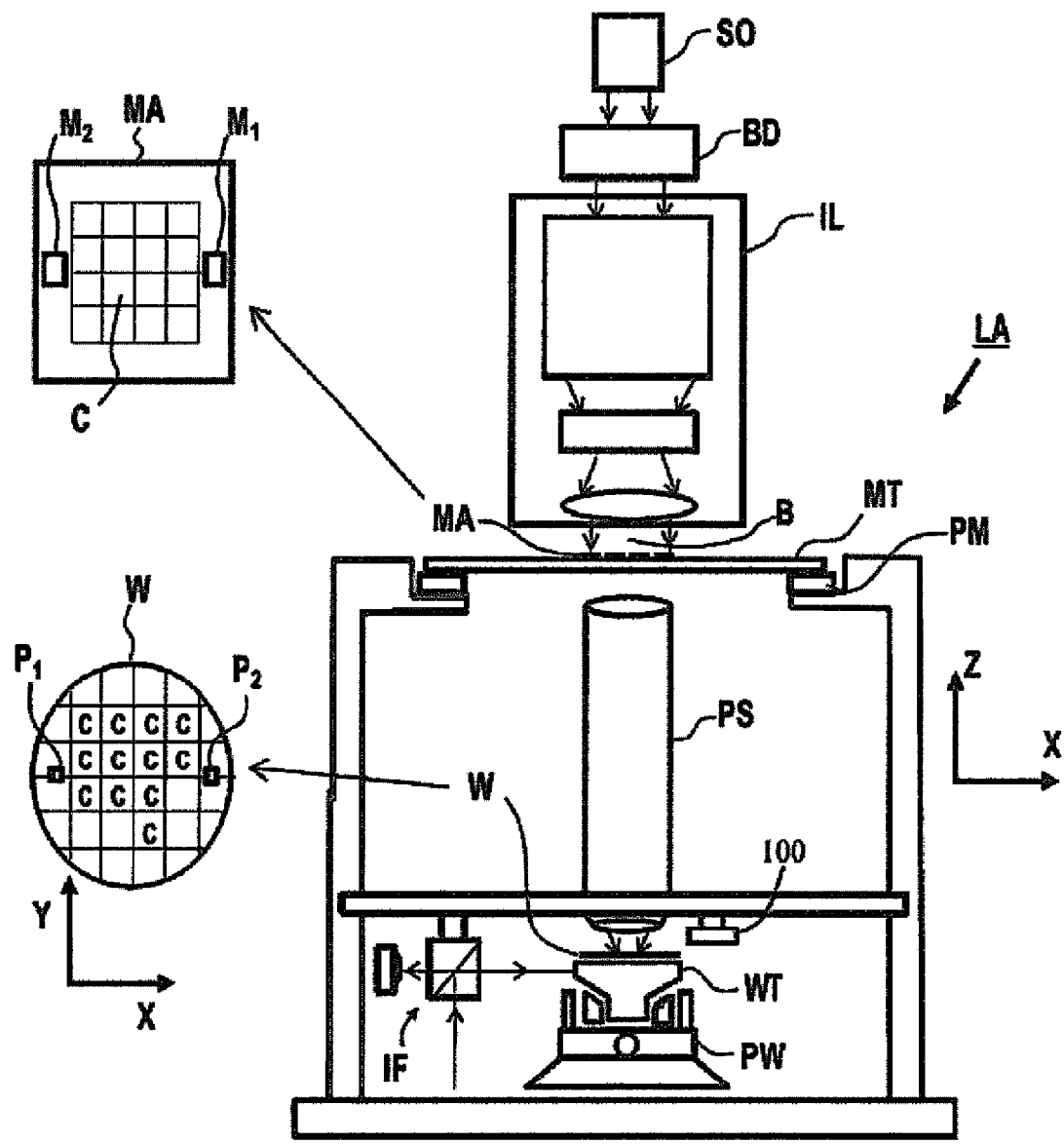
FIG. 1 depicts a schematic overview of a lithographic apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems, apparatus, and methods consistent with aspects related to the invention as recited in the appended claims. Relative dimensions of components and structures in the drawing may be exaggerated for clarity.

In the present disclosure, the terms "radiation" and "beam" are used to encompass all types of electromagnetic radiation, including ultraviolet radiation (e.g. with a wavelength of 365, 248, 193, 157 or 126 nm) and EUV radiation (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

FIG. 1 schematically depicts a lithographic apparatus LA comprising a sensor apparatus 100 according to an embodiment of the invention. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross-section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate W may be covered by a liquid having a relatively high refractive index, e.g., water, so as to fill a space between the projection system PS and the substrate W. This use of liquid may be referred to as immersion lithography. More information on immersion techniques is given in U.S. Pat. No. 6,952,253, filed Nov. 12, 2003 and titled "Lithographic Apparatus and Device Manufacturing Method", the entirety of which is incorporated herein by reference.

The lithographic apparatus LA may also be of a type having two or more substrate supports WT (also named "dual stage" or "multiple stage"). In such "multiple stage" machines, the substrate supports WT may be used in parallel. Additionally or alternatively, steps involved in the preparation of a subsequent exposure of the substrate W may be carried out on the substrate W located on one of the substrate supports WT while another substrate W on the other substrate support WT is being used for the exposure of a pattern on the other substrate W. For example, one or more of the steps involved in the preparation of a subsequent exposure of the substrate W may include using the sensor apparatus 100 to determine a position of a target of the substrate W on one of the substrate supports WT while an exposure of another substrate on the other support takes place.

In addition to the substrate support WT, the lithographic apparatus LA may comprise a measurement stage. The measurement stage is arranged to hold a sensor and/or a cleaning device. The sensor may be arranged to measure a property of the projection system PS and/or a property of the radiation beam B. The measurement stage may hold multiple sensors. The measurement stage may, for example, hold the sensor apparatus 100. The cleaning device may be arranged to clean part of the lithographic apparatus LA, for example a part of the projection system PS or a part of a system that provides the immersion liquid. The measurement stage may move beneath the projection system PS when the substrate support WT is not beneath the projection system PS.

In operation, the radiation beam B is incident on the patterning device, e.g., mask, MA which is held on the mask support MT, and is patterned by the pattern (i.e. design layout) present on patterning device MA. Having interacted with the mask MA, the radiation beam B passes through the projection system PS, which focuses the radiation beam B onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. The patterning device MA and/or the substrate W may be aligned using targets such as mask alignment marks M1, M2 and substrate alignment marks P1, P2. Although the substrate alignment marks P1, P2 shown in the example of FIG. 1 occupy dedicated target portions C, the substrate alignment marks P1, P2 may be located in spaces between the target portions C. Substrate alignment marks P1, P2 are known as scribe-lane alignment marks when they are located between the target portions C.

To clarify the explanation a Cartesian coordinate system is used. The Cartesian coordinate system has three axes, i.e., an x-axis, a y-axis and a z-axis. Each of the three axes is orthogonal to the other two axes. A rotation around the x-axis may be referred to as an Rx-rotation. A rotation around the y-axis may be referred to as an Ry-rotation. A rotation around about the z-axis may be referred to as an Rz-rotation. The x-axis and the y-axis may be described as defining a horizontal plane, whereas the z-axis may be described as being in a vertical direction relative to the horizontal plane. The Cartesian coordinate system is merely used for clarification only. Alternatively, another coordinate system, such as a cylindrical coordinate system, may be used to clarify the invention. The orientation of the Cartesian coordinate system may vary such that, for example, the z-axis has a component along the horizontal plane.

Figure 2:
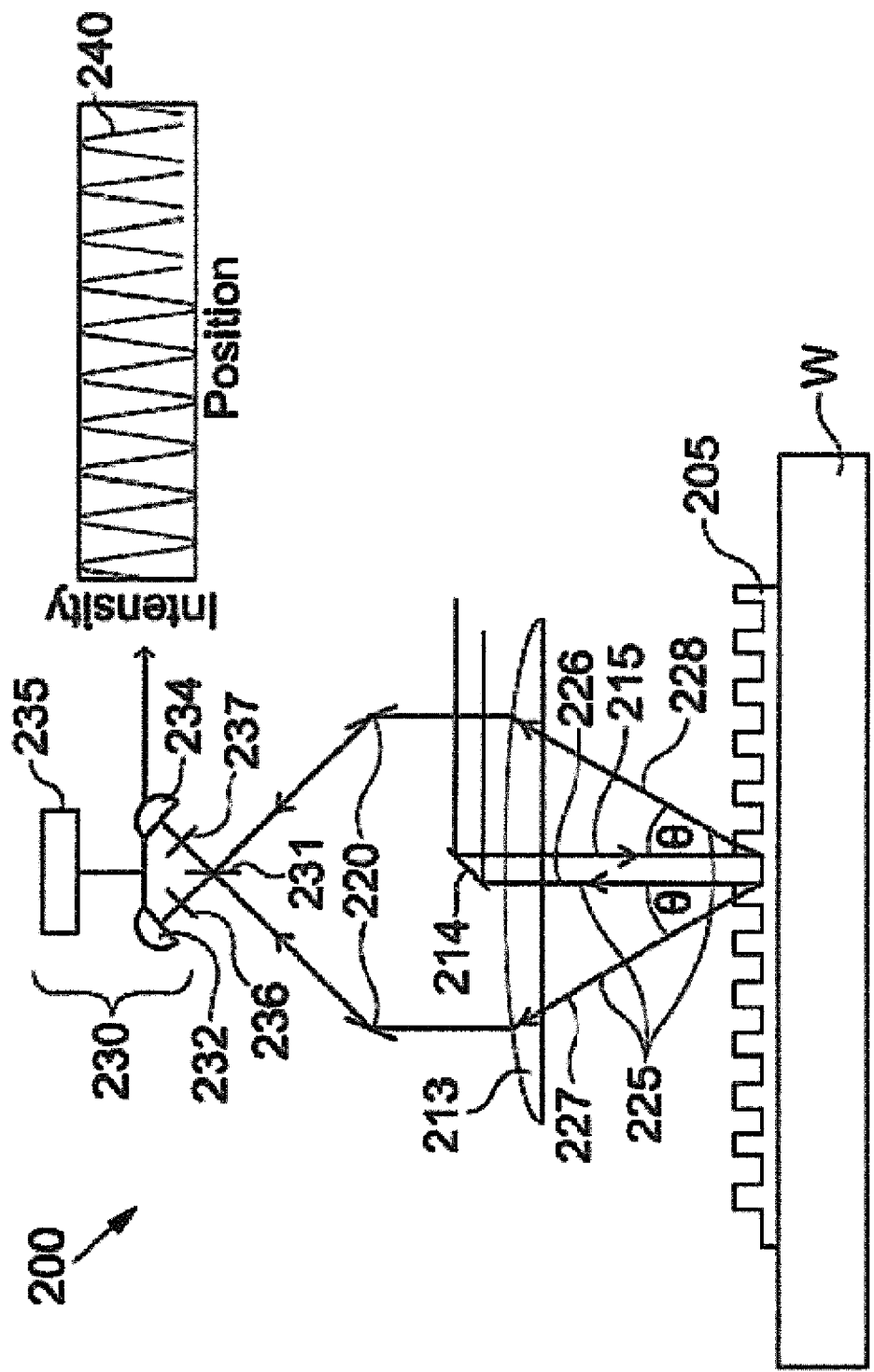
FIG. 2 schematically depicts a portion of a known sensor apparatus.

FIG. 2 schematically depicts a portion of a known sensor apparatus 200 for determining a position of a target 205 of a substrate W. The target 205 may, for example, be a substrate alignment mark (e.g., the substrate alignment marks P1, P2 shown in FIG. 1). In the example of FIG. 2, the target 205 comprises a grating located on an uppermost surface of the substrate W.

The target 205 may be located elsewhere on the substrate W, e.g., buried beneath one or more layers of the substrate W. The known sensor apparatus 200 comprises projection optics configured to project a radiation beam 215 onto the substrate W. In the example of FIG. 2, the projection optics comprises a reflective element 214 that reflects the radiation beam 215 towards a lens 213 which then focuses the radiation beam 215 onto the substrate W. The projection optics may comprise other optical elements. The radiation beam 215 scatters from the target 205 to form measurement radiation 225. In the example of FIG. 2, the radiation beam 215 diffracts from the target 205 to form measurement radiation 225 comprising a plurality of diffraction orders 226-228. For clarity of understanding, only the zeroth diffraction order 226, the plus one diffraction order 227 and the minus one diffraction order 228 are shown in FIG. 2. However, it will be appreciated that the measurement radiation 225 may comprise a greater number of diffraction orders 226-228. The zeroth diffraction order 226 returns to the projection optics and is directed away from the sensor apparatus 200. The plus one and minus one diffraction orders 227, 228 scatter from the target 205 at corresponding diffraction angles 8. The diffraction angles 8 may differ from one another. The sensor apparatus 200 further comprises collection optics configured to collect the measurement radiation 225 that has scattered from the target 205. In the example of FIG. 2 the collection optics comprise the lens 213 (that also forms part of the projection optics) and a pair of reflective elements 220. The plus one and minus one diffraction orders 227, 228 are collimated by the lens 213 and are reflected towards each other by the reflective elements 220 of the collection optics.

The sensor apparatus 200 further comprises a measurement system 230 configured to determine the position of the target 205 in at least partial dependence on the collected measurement radiation 225. In the example of FIG. 2 the measurement system 230 comprises a beam splitter 231, a pair of focusing elements 236, 237 and a pair of photodetectors 232, 234. The pair of photodetectors 232, 234 are in communication with a processor 235. The beam splitter 231 splits the plus one diffraction order 227 such that at least some of the plus one diffraction order 227 is incident on a first focusing element 236 and a first photodetector 232 and at least some of the plus one diffraction order 227 is incident on a second focusing element 237 and the second photodetector 234. The beam splitter 231 also splits the minus one diffraction order 228 such that at least some of the minus one diffraction order 228 is incident on the first photodetector 232 and at least some of the minus one diffraction order 238 is incident on the second photodetector 234.

The beam splitter 231 therefore directs a part of each of the plus one diffraction order 227 and the minus one diffraction order 228 to each of the first and second photodetectors 232, 234. In particular, the beam splitter 231 directs a part of each of the plus one diffraction order 227 and the minus one diffraction order 228 to the first photodetector 232 with a first relative phase between them and directs a part of each of the plus one diffraction order 227 and the minus one diffraction order 228 to the second photodetector 234 with a second relative phase between them. In this way, the measurement system 230 behaves similarly to a Mach-Zehnder interferometer. The photodetectors 232, 234 are configured to measure an intensity of the resulting interference between the plus one diffraction order 227 and the minus one diffraction order 228 and generate a corresponding measurement signal.

In general, the phase of each individual diffraction beam that results from the scattering from a diffraction grating is dependent on the position of the incident radiation beam relative to the diffraction grating. If the beam spot of the incident radiation beam is scanned over the diffraction grating then the phase of the diffraction beams formed will vary.

An actuation system (not shown) is configured to generate relative movement between the substrate W and the sensor apparatus 200 while the radiation beam 215 is incident on the target 205. As a result an interference pattern 240 is generated, which oscillates with relative movement between the substrate W and the sensor apparatus 200. The processor 235 is configured to receive the measurement signal that is indicative of the interference pattern 240 and determine a position of the target 205 in dependence on the measurement signal. The processor 235 may, for example, be configured to determine a phase offset of the interference pattern 240 and thereby determine a positional offset between the target 205 and the sensor apparatus 200. Determining the phase offset of the interference pattern 240 may comprise performing a phase fit on the interference pattern 240. The phase fit may comprise performing any suitable fitting method such as, for example, a least squares fit or a Fourier decomposition. The phase offset is used to determine the position of the target 205.

The determined position of the target 205 of the substrate W is dependent on the phase and the intensity distributions of the measured diffraction orders 227, 228. The phase and intensity distribution of the diffraction orders 227, 228 may be affected by a plurality of error sources. The error sources may, for example, include deformations and/or asymmetries of the target 205, variations of the thickness and/or material layers of the substrate W, variation in the local height, and slope, focus errors (e.g., an unintended tilt of the substrate W and/or a telecentricity of an optical system) and/or optical aberrations of the optical elements 213, 220 of the sensor apparatus 200. At least some of the error sources may change over time. The error sources may cause a shift of the resulting interference pattern 240. In turn, such a shift is interpreted by the processor 235 as a shift in position of the target 205. Therefore, the shift in the interference pattern 240 caused by the error sources has a negative effect on the accuracy of measurements performed using the known sensor apparatus 200. For example, the shift of the interference pattern 240 caused by the error sources may result in a target position measurement error. Target position measurement errors may negatively affect a lithographic process that is subsequently performed on the substrate W. For example, the substrate W may be misaligned with exposure radiation of a lithographic apparatus during a subsequent lithographic exposure, resulting in faulty devices being manufactured by the lithographic apparatus.

Limitations on the present systems include limitations on accuracy due to coupling between process variation and internal sensor errors. The angular content of the diffraction orders reflected off an alignment mark are dependent on the thickness of and/or material used to make the layers of the substrate. Variation of thickness and/or material layers of the substrate causes a re-weighting of the angular content of the diffraction orders. This can be approximated (to the first order) as a displacement of diffraction orders in the pupil plane. A displaced diffraction order will pick up a phase offset due to sensor aberrations different from those determined during calibration. This results in an aligned position error that is process dependent. Measurement of angular content of diffraction orders is used to correct corresponding alignment position errors.

Variation in local height and slope are additional sources of alignment position errors that cannot be calibrated out. Measuring local height and slope can be used to correct for corresponding alignment position errors.

According to one aspect of an embodiment, a metrology system is configured to obtain a hyperspectral measurement of diffraction order properties inside the optical module at different locations. The measurement of spatial and spectral content of the diffraction orders at multiple planes is used to correct for process induced alignment position errors. The measurement is simultaneous for all spectral channels.

According to an aspect of an embodiment, a hyper spectral metrology system includes a configurable spatial light modulator, multimode fiber, and spectral demultiplexer to extract specific spatial information over many spectral bands. The concepts can be extended to any hyper spectral imaging application. Depending on the application, irradiance distribution is modulated using orthonormal basis functions such as Zernike functions, binary wavelet transforms, HAAR, etc.

Hyper spectral detection of diffraction order center of gravity shift at the pupil can enable correction of alignment errors induced by the coupling between sensor errors and process variation. Hyper spectral detection of anti-symmetric shift between ±1st diffraction orders can enable correction for mark asymmetry.

Irradiance distribution of diffraction orders are usually of radial symmetry. This is better described using Zernike polynomials. The Zernike polynomials are orthonormal on a unit circle. The Zernike polynomials are usually defined in polar coordinates ($\rho$, $\emptyset$), where $\rho$ is the radial coordinate ranging from 0 to 1 and $\emptyset$ is the azimuthal component ranging from 0 to $2\pi$. The irradiance distribution of diffraction order can be represented as a linear expansion into these orthogonal polynomials. The representation is continuous, facilitating the calculation of the integrals needed for reconstructing various slices through the light field.

Figure 3:
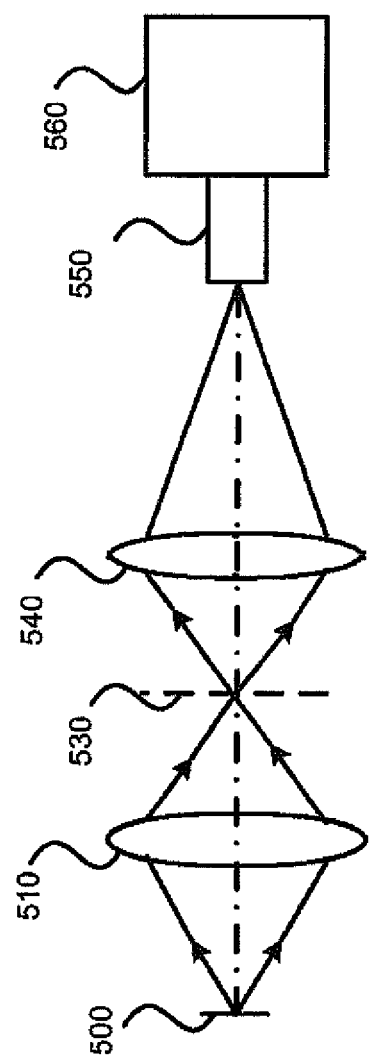
FIG. 3 is a diagram of a hyper spectral sensing system according to an aspect of an embodiment.

In FIG. 3 numeral 500 denotes an irradiance distribution, spatial and spectral contents of which is to be measured. The lens 510 reimages the irradiance distribution onto a configurable spatial light modulator 530. If the irradiance distribution of the object 500 is $I(\rho,\emptyset)$ then the product $I(\rho,\emptyset,\lambda) Z_i(\rho,\emptyset)$ is equivalent to an apodization ($Z_i$) applied by the configurable spatial light modulator 530 to the original irradiance distribution I. The lens 540 couples the modulated irradiance distribution at the spatial light modulator 530 into a multimode fiber 550. Reimaging the modulated irradiance distribution into the multimode fiber 550 is equivalent to the integration step $$C_i(\lambda) = \iint I(\rho,\emptyset,\lambda) Z_i(\rho,\emptyset) d\rho d\emptyset$$

A spectrometer 560 extracts the contribution of each spectral channel (in the example, the Zernike coefficient) to the irradiance distribution. The speed of the spatial light modulator enables decomposing the original irradiance distribution into many spectral components. The configurable spatial light modulator can be implemented, for example, using a digital micromirror device (DMD), liquid crystal device (LCD), liquid crystal on silicon (LCoS), micro-electro-mechanical systems (MEMS), or similar digital light processing systems. In a specific implementation the spatial light modulator is replaced with a constant apodizer, apodization of which is described as a low order polynomial.

The single mode fiber 550 in essence integrates the irradiance distribution. The spectrometer (implemented, e.g., as a demultiplexer and a photodetector) can then decompose the integrated irradiance profile to extract contributions to the profile for each spectral channel. For example, the irradiance distribution may be regarded as a superposition (linear combination) of normal basis functions, and the demultiplexer can find the coefficient of each of the basis functions to determine their individual contribution to the overall distribution.

Figure 4:
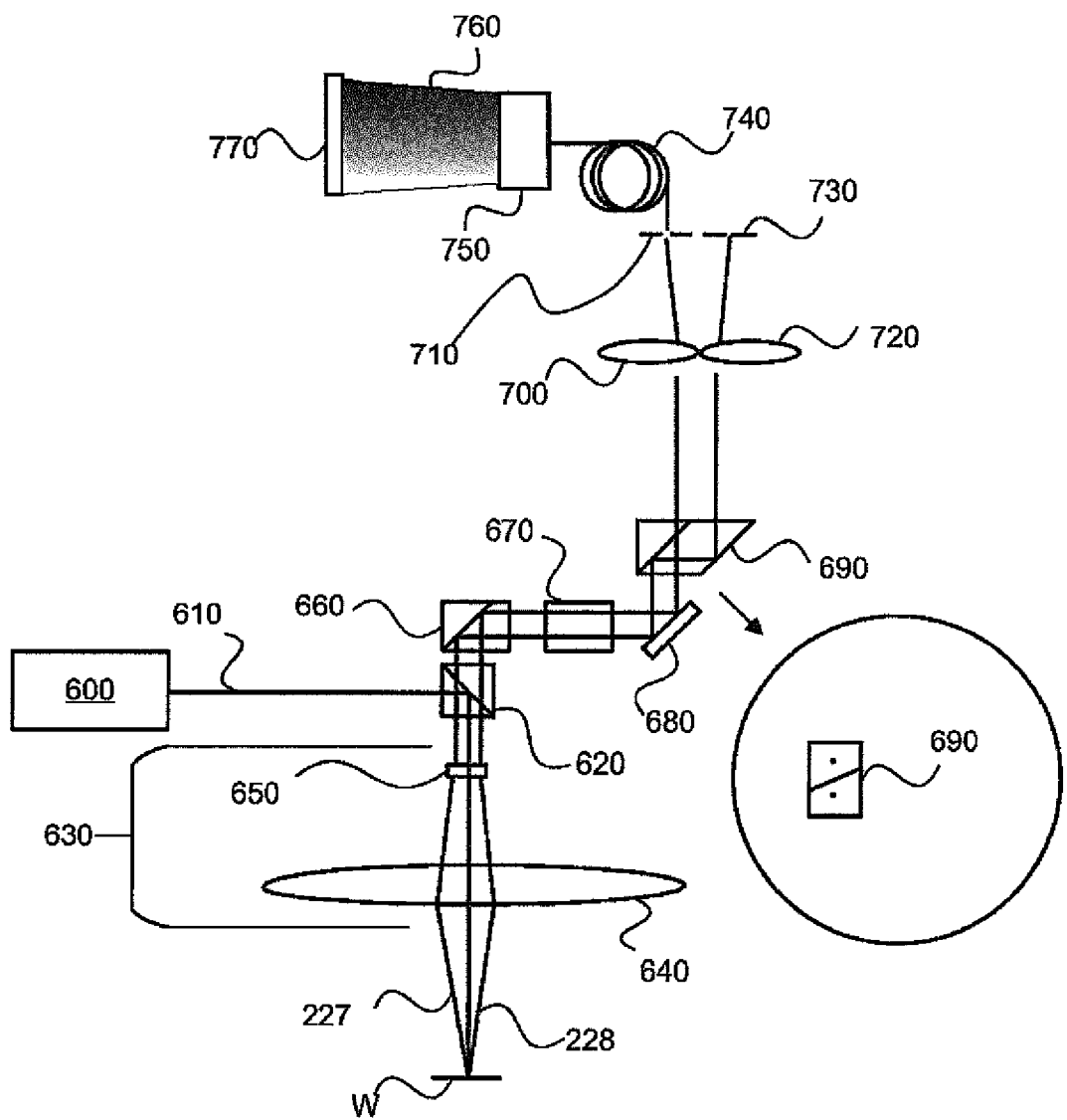
FIG. 4 is a diagram of a hyper spectral sensing system according to an aspect of an embodiment.

FIG. 4 shows a metrology system for detecting variation in the angular spectrum of the diffraction orders. Light source 600 generates an illumination beam 610 which is reflected by spot mirror 620 and impinges on the wafer W. The illumination beam 610 is diffracted by a target on the wafer W and the diffraction orders 227 and 228 are collected by the objective lens system 630 including lens 640 and optics 650. A beam splitter 660 redirects the light to the metrology channel. A relay system 670 relays the pupil plane to the spatial light modulator 680 which modulates diffraction orders. The modulated diffraction orders are then split by a pupil divider 690. The optics 700, 720 couples modulated diffraction orders into multi-mode output fibers behind the field stops 710 and 730 respectively. The multi-mode output fiber 740 relays the light to the spectrometer 750, which separates the light into spectral components in a spectral distribution 760. A detector array 770 detects the intensity from each color. The measured angular spectrum of diffraction orders is used to correct for process variation alignment position errors at different spectral channels.

Figure 5:
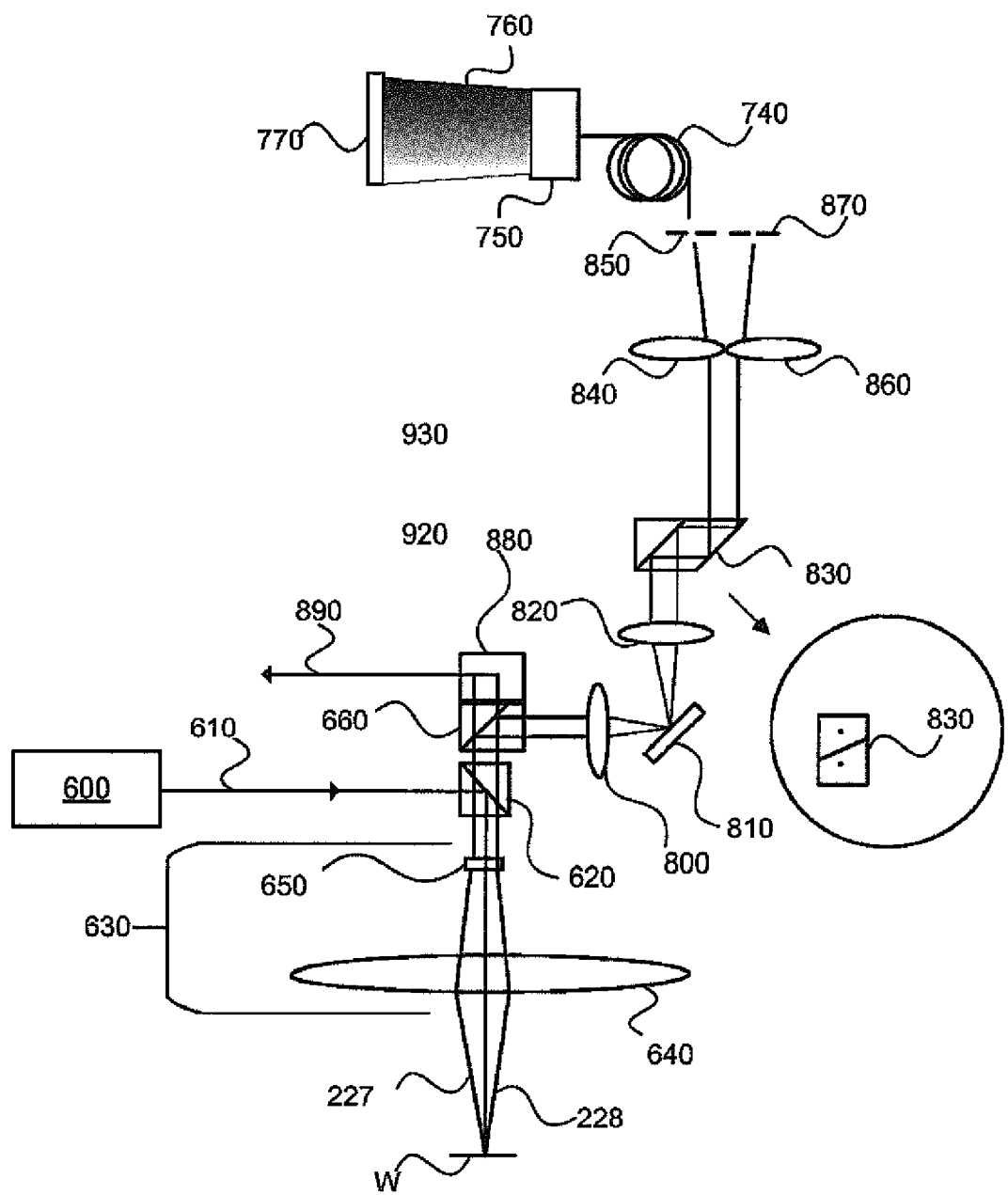
FIG. 5 is a diagram of a hyper spectral sensing system according to an aspect of an embodiment.

FIG. 5 shows a metrology system for measuring local height and slope. As in the previous embodiment, light source 600 generates an illumination beam 610 which is reflected by spot mirror 620 and impinges on the wafer W. The illumination beam 610 is diffracted by a target on the wafer W and the plus and minus first diffraction orders 227 and 228 are collected by the objective lens system 630 including lens 640 and optics 650. A beam splitter 660 redirects the light to a first metrology channel including lens 800, spatial light modulator 810, lens 820, and pupil divider 830 which splits the diffraction orders. An optic system 840 re-images modulated diffraction orders onto multi-mode output fiber located after output field stops 850 and 870. The fibers 740 relay the light onto a spectrometer 750 and sensor 760 as described above. The arrangement of FIG. 5 also includes a pick-off mirror 880 which diverts the diffraction orders of orthogonal polarization into a second metrology channel 890. Using such an arrangement, hyperspectral detection of the diffraction order displacements are related to local height and slope. Knowledge of local height and slope enables correction for corresponding alignment position errors.

Figure 6:
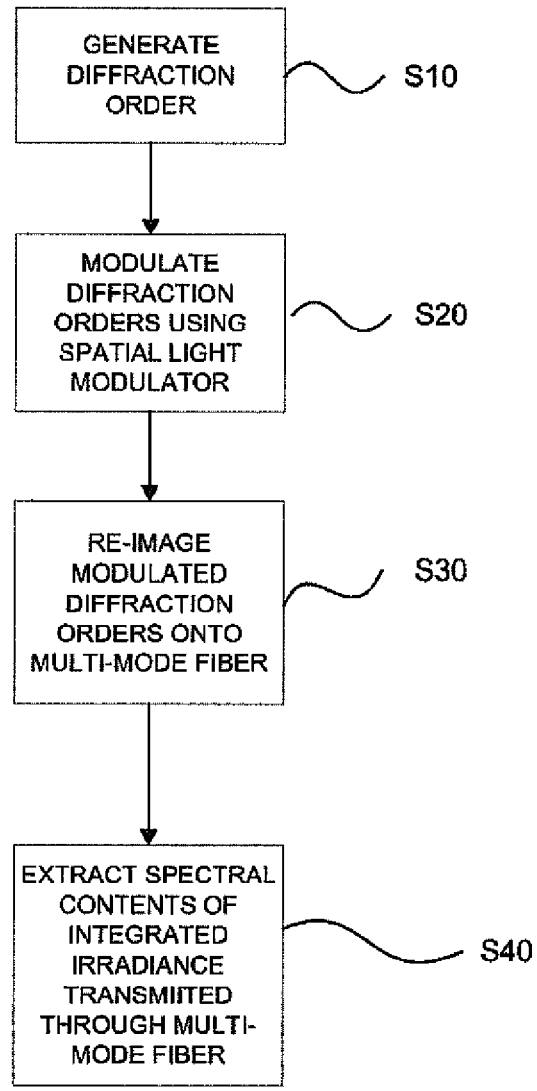
FIG. 6 is a flowchart describing a method of hyperspectral sensing in an alignment sensing system.

According to another aspect of an embodiment, a method of extracting spectral information from an irradiance distribution is shown in the flowchart of FIG. 6. In a step S10 a diffraction order is collected from irradiating a target. In a step S20 the diffraction order is modulated in the pupil plane of an optical system arranged to collect the diffraction order. In a step S30, the modulated diffraction order is integrated by coupling it into a solid state optical device such as a multi-mode fiber. In a step S40, the spectral content of the integrated modulated diffraction order is determined, for example, by spectrometer which may be implemented as a demultiplexer and a photodetector.

The embodiments may further be described using the following clauses:

1. Apparatus for measuring a parameter of an alignment mark on a substrate, the apparatus comprising:
    an optical system arranged to receive at least one diffraction order from the alignment mark and including a configurable spatial light modulator to modulate an irradiance distribution of the at least one diffraction order at a pupil plane of the optical system, and/or plane conjugate to alignment mark plane, to produce a modulated diffraction order; and
    a solid state optical device arranged to receive the modulated diffraction order.
2. The apparatus of clause 1 further comprising a spectrometer arranged to receive the modulated diffraction order from the solid state optical device and to determine an intensity of one or more spectral components in the modulated diffraction order.
3. The apparatus of clause 1 or 2 wherein the diffraction order is a first order diffraction order.
4. The apparatus of any one of clauses 1-3 wherein the configurable spatial light modulator comprises a constant apodizer performing an apodization characterized as a low order polynomial.
5. The apparatus of any one of clauses 1-3 wherein the configurable spatial light modulator comprises a digital micromirror device.
6. The apparatus of any one of clauses 1-3 wherein the configurable spatial light modulator comprises a liquid crystal device.
7. The apparatus of any one of clauses 1-3 wherein the configurable spatial light modulator comprises a liquid crystal on silicon device.
8. The apparatus of any one of clauses 1-3 wherein the configurable spatial light modulator comprises a micro-electro-mechanical system.
9. The apparatus of any one of clauses 1-3 wherein the configurable spatial light modulator shapes the diffraction order according to at least one normal basis function.
10. The apparatus of clause 2 wherein the spectrometer comprises a plurality of dichroic mirrors and a plurality of photo detectors.
11. The apparatus of clause 2 wherein the spectrometer comprises a demultiplexer and wherein the demultiplexer extracts a coefficient of the at least one basis function.
12. The apparatus of clause 2 wherein the spectrometer comprises a demultiplexer and a photo detector.
13. The apparatus of any one of clauses 1-12 wherein the solid state optical device comprises a multi-mode optical fiber.
14. The apparatus of any one of clauses 1-13 wherein the parameter is asymmetry in the alignment mark.
15. The apparatus of any one of clauses 1-13 wherein the parameter is variation in angular content of diffraction order measured at the pupil or wafer conjugate planes.
16. The apparatus of clause 16 wherein the variation is displacement in the center of gravity of diffraction order irradiance distribution.
17. The apparatus of any one of clauses 1-13 wherein the parameter is an amount of tilt in the alignment mark.
18. The apparatus of any one of clauses 1-13 wherein the parameter is a height variation in a position of the alignment mark.
19. A method of measuring a parameter of an alignment mark on a substrate, the method comprising:
    generating at least one diffraction order; and
    modulating the diffraction order in a pupil or wafer conjugate plane.

20. The method of clause 19 further comprising the steps of
using a solid state optical device to integrate the diffraction order; and
determining spectral content of the diffraction order.
21. The method of clause 19 wherein the diffraction order is a first order diffraction order.
22. The method of any one of clauses 19-21 wherein the modulating step is performed by a spatial light modulator.
23. The method of any one of clauses 19-21 wherein the modulating step is performed by a digital micromirror device.
24. The method of any one of clauses 19-21 wherein the modulating step is performed by a liquid crystal device.
25. The method of any one of clauses 19-21 wherein the modulating step is performed by a liquid crystal on silicon device.
26. The method of any one of clauses 19-21 wherein the modulating step is performed by a micro-electro-mechanical system.
27. The method of any one of clauses 19-21 wherein the modulating step comprises shaping the diffraction order according to at least one normal basis function.
28. The method of any one of clauses 17-25 wherein the step of using a solid state optical device to integrate the diffraction order solid state optical device is performed using a multi-mode optical fiber.
29. The method of clause 20 wherein the step of determining spectral content of the diffraction order comprises extracting a coefficient of the at least one basis function.
30. The method of clause 20 wherein the step of determining spectral content of the diffraction order is performed by a spectrometer comprising a demultiplexer and a photo detector.
31. The method of any one of clauses 17-30 wherein the parameter is asymmetry in the alignment mark.
32. The method of any one of clauses 17-30 wherein the parameter is variation in angular content of diffraction order measured at the pupil or wafer conjugate plane.
33. The method of clause 32 wherein the variation is displacement in the center of gravity of a diffraction order irradiance distribution.
34. The method of any one of clauses 17-30 wherein the parameter is an amount of tilt in the alignment mark.
35. The method of any one of clauses 17-30 wherein the parameter is a height variation in a position of the alignment mark.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, 10 where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. Apparatus for measuring a parameter of an alignment mark on a substrate, the apparatus comprising:
an optical system arranged to receive at least one diffraction order from the alignment mark and including a configurable spatial light modulator to modulate an irradiance distribution of the at least one diffraction order at a pupil plane of the optical system, and/or at a plane conjugate to an alignment mark plane, to produce a modulated diffraction order having a change in intensity due to the modulation; and
a solid state optical device arranged to receive the modulated diffraction order having the varied intensity.

2. The apparatus of claim 1, further comprising a spectrometer arranged to receive the modulated diffraction order from the solid state optical device and to determine an intensity of one or more spectral components in the modulated diffraction order.

3. The apparatus of claim 2, wherein the spectrometer comprises a plurality of dichroic mirrors and a plurality of photo detectors.

4. The apparatus of claim 2, wherein the spectrometer comprises a demultiplexer configured to extract a coefficient of at least one basis function.

5. The apparatus of claim 2, wherein the spectrometer comprises a demultiplexer and a photo detector.

6. The apparatus of claim 1, wherein the diffraction order is a first order diffraction order.

7. The apparatus of claim 1, wherein the configurable spatial light modulator is replaced by a constant apodizer configured to perform an apodization characterized as a low order polynomial.

8. The apparatus of claim 1, wherein the configurable spatial light modulator comprises a digital micromirror device.

9. The apparatus of claim 1, wherein the configurable spatial light modulator comprises a liquid crystal device.

10. The apparatus of claim 1, wherein the configurable spatial light modulator comprises a liquid crystal on silicon device.

11. The apparatus of claim 1, wherein the configurable spatial light modulator comprises a micro-electro-mechanical system.

12. The apparatus of claim 1, wherein the configurable spatial light modulator is configured to shape the diffraction order according to at least one normal basis function.

13. The apparatus of claim 1, wherein the solid state optical device comprises a multi-mode optical fiber.

14. The apparatus of claim 1, configured to determine the parameter based on the modulated diffraction order, wherein the parameter is asymmetry in the alignment mark.

15. The apparatus of claim 1, configured to determine the parameter based on the modulated diffraction order, wherein the parameter is variation in angular content of diffraction order measured at the pupil or alignment mark conjugate plane.

16. The apparatus of claim 15, wherein the variation is displacement in the center of gravity of diffraction order irradiance distribution.

17. The apparatus of claim 1, configured to determine the parameter based on the modulated diffraction order, wherein the parameter is an amount of tilt in the alignment mark.

18. The apparatus of claim 1, configured to determine the parameter based on the modulated diffraction order, wherein the parameter is a height variation in a position of the alignment mark.

19. A method for measuring a parameter of an alignment mark on a substrate, the method comprising:
  generating at least one diffraction order from the alignment mark; and
  modulating an irradiance distribution of the at least one diffraction order at a pupil plane and/or at a plane conjugate to an alignment mark plane, to produce a modulated diffraction order having a change in intensity due to the modulation.

20. The method of claim 19, further comprising:
  using a solid state optical device to integrate the modulated diffraction order; and
  determining spectral content of the modulated diffraction order.

* * * * *